(12) United States Patent
Kawamura

(10) Patent No.: US 11,555,863 B2
(45) Date of Patent: Jan. 17, 2023

(54) GROUND FAULT DETECTION DEVICE

(71) Applicant: Yazaki Corporation, Tokyo (JP)

(72) Inventor: Yoshihiro Kawamura, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 357 days.

(21) Appl. No.: 17/070,044

(22) Filed: Oct. 14, 2020

(65) Prior Publication Data
US 2021/0148992 A1 May 20, 2021

(30) Foreign Application Priority Data

Nov. 15, 2019 (JP) .............................. JP2019-207047

(51) Int. Cl.
| | |
|---|---|
| *G01R 31/00* | (2006.01) |
| *G01R 31/52* | (2020.01) |
| *B60L 3/00* | (2019.01) |
| *H02J 7/00* | (2006.01) |
| *H02J 7/34* | (2006.01) |
| *B60L 50/60* | (2019.01) |

(52) U.S. Cl.
CPC ............ *G01R 31/52* (2020.01); *B60L 3/0046* (2013.01); *B60L 50/60* (2019.02); *G01R 31/006* (2013.01); *H02J 7/0047* (2013.01); *H02J 7/345* (2013.01); *H02J 2207/50* (2020.01)

(58) Field of Classification Search
CPC .... G01R 31/382; G01R 31/52; G01R 31/006; B60L 50/60; B60L 3/0046; H02J 7/0047; H02J 7/345; H02J 2207/50; Y02T 10/70
See application file for complete search history.

(56) References Cited

U.S. PATENT DOCUMENTS

| | | | |
|---|---|---|---|
| 10,379,150 B2 | 8/2019 | Kawamura | |
| 2017/0160334 A1* | 6/2017 | Kawanaka | .............. B60L 53/50 |
| 2018/0224493 A1* | 8/2018 | Kawamura | .......... G01R 31/382 |
| 2019/0100104 A1* | 4/2019 | Kawamura | ............ G01R 31/14 |
| 2021/0072324 A1* | 3/2021 | Kawamura | .......... G01R 31/006 |
| 2021/0148993 A1* | 5/2021 | Takamatsu | ............. G01R 31/52 |

FOREIGN PATENT DOCUMENTS

JP     2018-128320 A     8/2018

* cited by examiner

*Primary Examiner* — Jermele M Hollington
*Assistant Examiner* — Suresh K Rajaputra
(74) *Attorney, Agent, or Firm* — Sughrue Mion, PLLC

(57) ABSTRACT

A ground fault detection device compatible with Y capacitors of various capacities without increasing the capacitance of a detection capacitor is provided. The ground fault detection device includes a first detection capacitor that operates as a flying capacitor, a second detection capacitor that operates as a flying capacitor, a control unit measures the charging voltage of the first detection capacitor and the second detection capacitor, a switching unit that switches between a state using a first measurement system in which the first detection capacitor is charged with the high voltage battery and the charging voltage of the first detection capacitor is measured by the control unit, and a state using a second measurement system in which the second detection capacitor is charged with the high voltage battery and the charging voltage of the second detection capacitor is measured by the control unit.

14 Claims, 14 Drawing Sheets

GROUND FAULT DETECTION DEVICE

BACKGROUND OF THE INVENTION

Field of the Invention

The present invention relates to a ground fault detection device using a flying capacitor.

Description of the Related Art

In a vehicle such as a hybrid vehicle having an engine and an electric motor as a drive source and an electric vehicle, a battery mounted on a vehicle body is charged and electric power supplied from the battery is used to generate propulsion. Generally, a battery-related power supply circuit is configured as a high-voltage circuit that handles a high voltage of 200 V or more, and in order to ensure safety, the high-voltage circuit including the battery has a non-grounded configuration that is electrically insulated from the vehicle body that serves as a reference potential point of ground.

In a vehicle equipped with a non-grounded high voltage battery, a ground fault detection device is provided for monitoring an insulation state (ground fault) between a system in which the high voltage battery is provided, specifically, a main power supply system across the high voltage battery and the vehicle body. A method using a capacitor called a flying capacitor is widely used for the ground fault detection device.

FIG. 14 is a diagram showing a circuit example of a conventional ground fault detection device of a flying capacitor type. As shown in the figure, a ground fault detection device 400 is a device that is connected to a non-grounded high voltage battery 300 and detects ground fault of the system provided with the high voltage battery 300. Here, an insulation resistor between the positive-electrode-side of the high voltage battery 300 and the ground is represented by RLp, and an insulation resistor between negative-electrode-side and the ground is represented by RLn.

As shown in this figure, the ground fault detection device 400 includes a detection capacitor C1 that operates as a flying capacitor. Further, in order to switch a measurement path and control charging and discharging of the detection capacitor C1, a positive-electrode-side C contact switch 111 is provided at one end of the detection capacitor C1 and a negative-electrode-side C contact switch 112 is provided at the other end of the detection capacitor C1.

A common contact c is arranged on the detection capacitor C1 side for both the positive-electrode-side C contact switch 111 and the negative-electrode-side C contact switch 112. Both the positive-electrode-side C contact switch 111 and the negative-electrode-side C contact switch 112 have a contact a on the high voltage battery 300 side, and have a contact b on the control device 410 side (ground-side).

In the ground fault detection device 400, in order to grasp the insulation resistors RLp and RLn, measurement operation is repeated with the V0 measurement period→Vc1n measurement period→V0 measurement period→Vc1p measurement period as one cycle. In any measurement period, the detection capacitor C1 is charged with the voltage to be measured, and then the charging voltage of the detection capacitor C1 is measured. Then, the detection capacitor C1 is discharged for the next measurement.

During the V0 measurement period, the voltage corresponding to the high voltage battery 300 voltage is measured. Therefore, both the positive C contact switch 111 and the negative C contact switch 112 are switched to the contact a side to charge the detection capacitor C1. That is, the high voltage battery 300, the resistors Ra and R1, the detection capacitor C1, and the resistor Rb serve as the measurement path.

When measuring the charging voltage of the detection capacitor C1, both the positive-electrode-side C contact switch 111 and the negative-electrode-side C contact switch 112 are switched to the contact b side, and a control device 410 performs sampling. After that, the detection capacitor C1 is discharged for the next measurement. At the time of measuring the charging voltage of the detection capacitor C1, operation at the time of discharging the detection capacitor C1 is the same in other measurement periods.

During Vc1n measurement period, the voltage that reflects influence of the insulation resistor RLn is measured. Therefore, the positive-electrode-side C contact switch 111 is switched to the contact a side and the negative-electrode-side C contact switch 112 is switched to the contact b side to charge the detection capacitor C1. That is, the high voltage battery 300, the resistors Ra and R1, the detection capacitor C1, the resistor R3, the ground, and the insulation resistor RLn serve as the measurement path.

During Vc1p measurement period, the voltage that reflects influence of the insulation resistor RLp is measured. Therefore, the positive-electrode-side C contact switch 111 is switched to the contact b side and the negative-electrode-side C contact switch 112 is switched to the contact a side to charge the detection capacitor C1. That is, the high voltage battery 300, the insulation resistor RLp, the ground, the resistors R2 and R1, the detection capacitor C1, and the resistor Rb serve as the measurement path.

It is known that $(RLp \times RLn)/(RLp+RLn)$ can be obtained based on $(Vc1p+Vc1n)/V0$ calculated from V0, Vc1n, and Vc1p obtained during these measurement periods. Therefore, the control device 420 in the ground fault detection device 400 can grasp a combined resistance of the insulation resistors RLp, RLn by measuring V0, Vc1n, Vc1p. Then, when the combined resistance of the insulation resistors RLp and RLn becomes equal to or lower than a predetermined determination reference level, a ground fault is determined to have occurred and an alarm is output.

In each measurement period, when the detection capacitor C1 is fully charged, the voltage value of the high voltage battery 300 is obtained in the V0 measurement period, and a value simply dividing the high voltage battery 300 by the insulation resistor RLp and RLn is obtained in the Vc1n measurement period and the Vc1p measurement period, and the insulation resistance cannot be calculated by the above equation. Therefore, for example, a time for which the detection capacitor C1 is charged by about 50% is set as a charging time of each measurement period.

CITATION LIST

Patent Literature

[Patent Document 1] Japanese Patent Application Publication No. 2018-128320

SUMMARY OF THE INVENTION

Generally, in order to remove high-frequency noise of the power source and to stabilize the operation, capacitors CYp and CYn called Y capacitors (line bypass capacitors) are respectively connected between the positive-electrode-side power source line 301 and the ground electrode and between the negative-electrode-side power source line 302 and the ground electrode of the high voltage battery 300. The charges accumulated in the Y capacitor may transfer to the detection capacitor C1. However, when the capacitance of the Y capacitor is considerably smaller than the capacitance of the detection capacitor C1, the amount of the electric charges which transferred from the Y capacitor to the detection capacitor C1 is considerably smaller than the amount of the electric charges transferred from the high voltage battery 300 to the detection capacitor C1 and the detection of the ground fault is not influenced.

However, when the high voltage battery 300 is connected to high-voltage equipment such as charging equipment, a large capacitance Y capacitor is connected. In such a case, the amount of charge transferred from the Y capacitor to the detection capacitor C1 becomes a non-negligible amount as compared with the amount of charge transferred from the high voltage battery 300 to the detection capacitor C1, and the detection of the ground fault is influenced. If the capacitance of the detection capacitor C1 is increased in order to reduce this effect, the charging speed becomes slower by the increase and the measurement time becomes longer.

Therefore, it is an object of the present invention to provide a ground fault detection device compatible with Y capacitors of various capacities without increasing the capacitance of the detection capacitor.

In order to solve the above problems, the ground fault detection device of the present invention is a ground fault detection device that is connected to a high voltage battery and detects a decrease in insulation resistance of a system in which the high voltage battery is provided, and includes a first detection capacitor that operates as a flying capacitor, a second detection capacitor that operates as a flying capacitor, a control unit that measures charging voltages of the first detection capacitor and the second detection capacitor, a switching unit that switches between a state using a first measurement system in which the first detection capacitor is charged with the high voltage battery and the charging voltage of the first detection capacitor is measured by the control unit, and a state using a second measurement system in which the second detection capacitor is charged with the high voltage battery and the charging voltage of the second detection capacitor is measured by the control unit. A capacitance of the second detection capacitor may be smaller than a capacitance of the first detection capacitor, and in the second measurement system, the second detection capacitor may be fully charged with the high voltage battery, and the charging voltage of the second detection capacitor may be measured by the control unit.

Preferably, the ground fault detection device further includes a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected, a negative-electrode-side twin relay including a first negative-electrode-side C contact switch for switching between a battery negative-electrode-side contact and a ground-side contact, and a second negative-electrode-side C contact switch for switching between the battery negative-electrode-side contact and a ground-side contact, a first switch connected in series with the first detection capacitor between a common contact of the first positive-electrode-side C contact switch and a common contact of the first negative-electrode-side C contact switch; a second switch connected in series with the second detection capacitor between a common contact of the second positive-electrode-side C contact switch and a common contact of the second negative-electrode-side C contact switch; a third switch connected in series with a positive-electrode-side short circuit resistor between the battery positive-electrode-side and ground, a fourth switch connected in series with the negative-electrode-side short-circuit resistor between the battery negative-electrode-side and the ground, wherein the switching unit includes the first switch and the second switch, the control unit controls operations of the positive-electrode-side twin relay, the negative-electrode-side twin relay, the first switch, the second switch, the third switch, and the fourth switch, and detects a decrease in insulation resistance based on a voltage generated in the first measurement resistor or the second measurement resistor.

Preferably, the ground fault detection device further includes a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected, a negative-electrode-side twin relay including a first negative-electrode-side C contact switch for switching between a battery negative-electrode-side contact and a ground-side contact, and a second negative-electrode-side C contact switch for switching between the battery negative-electrode-side contact and a ground-side contact, a first switch connected in series with the first detection capacitor between a common contact of the first positive-electrode-side C contact switch and a common contact of the first negative-electrode-side C contact switch; a second switch connected in series with the second detection capacitor between a common contact of the second positive-electrode-side C contact switch and a common contact of the second negative-electrode-side C contact switch; a third C contact switch for switching between a contact connected with the battery positive-electrode-side and a contact connected with the battery negative-electrode-side; a third switch connected in series with a common contact of the third C contact switch and ground, the switching unit includes the first switch and the second switch, and the control unit controls operations of the positive-electrode-side twin relay, the negative-electrode-side twin relay, the first switch, the second switch, the third C contact switch, and the third switch, and detects a decrease in insulation resistance based on a voltage generated in the first measurement resistor or the second measurement resistor.

Preferably, the ground fault detection device further includes a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected, a negative-electrode-side twin relay including a first negative-electrode-side C contact switch for switching between a battery negative-electrode-side contact and a ground-side contact, and a second negative-electrode-side C contact switch for switching between the battery negative-electrodeside contact and a ground-side contact, a first switch connected in series with the first detection capacitor between a common contact of the first positive-electrode-side C contact switch and a common contact of the first negative-electrode-side C contact switch; a second switch connected in series with the second detection capacitor between a common contact of the second positive-electrode-side C contact switch and a common contact of the second negative-electrode-side C contact switch; a third switch connected with a short-circuit resistor between a common contact of the first positive-electrode-side C contact switch and a common contact of the first negative-electrode-side C contact switch, in parallel with the first detection capacitor and the first switch, the switching unit includes the first switch and the second switch, and the control unit controls operations of the positive-electrode-side twin relay, the negative-electrode-side twin relay, the first switch, the second switch, and the third switch, and detects a decrease in insulation resistance based on a voltage generated in the first measurement resistor or the second measurement resistor.

Preferably, the ground fault detection device further includes a fifth switch connected between the positive-electrode plate of the second detection capacitor and the measurement-side contact of the second positive-electrode-side C contact relay.

According to the present invention, there is provided a ground fault detection device compatible with Y capacitors having various capacities without increasing capacitance of the detection capacitor.

DETAILED DESCRIPTION OF THE PREFERRED EMBODIMENTS

<Ground Fault Detection Device 100>

Figure 1:
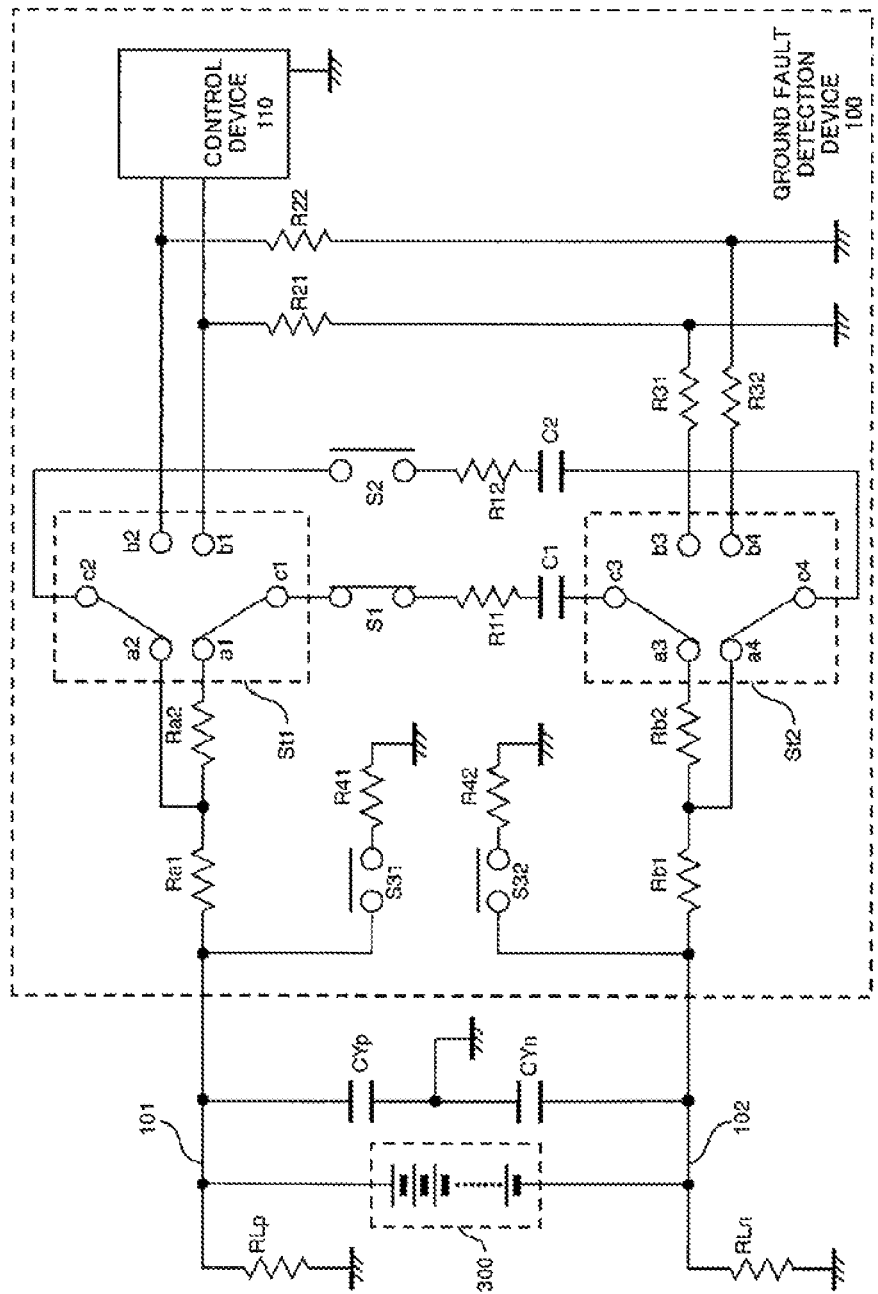
FIG. 1 is a block diagram showing a configuration of a ground fault detection device according to an embodiment of the present invention.

Embodiments of the present invention will be described in detail with reference to the drawings. FIG. 1 is a block diagram showing a configuration of a ground fault detection device 100 according to an embodiment of the present invention. As shown in the figure, the ground fault detection device 100 is a flying capacitor type device that is connected to a high voltage battery 300 and detects a ground fault of a system in which the high voltage battery 300 is provided. Here, an insulation resistor between a positive-electrode-side of the high voltage battery 300 and the ground is represented by RLp, and an insulation resistor between a negative-electrode-side and the ground is represented by RLn.

The high voltage battery 300 is a battery used for driving a vehicle. The high voltage battery 300 is composed of a rechargeable battery such as a lithium-ion battery, and discharges via a bus bar (not shown), and drives an electric motor connected via an inverter or the like. Also, when regenerating or connecting a charging equipment, charging is performed via the bus bar.

Generally, in order to remove high-frequency noise of a power source and to stabilize operation, capacitors CYp and CYn called Y capacitors (line bypass capacitors) are connected between a positive-electrode-side power source line 101 of the high voltage battery 300 and a ground electrode and between a negative-electrode-side power source line 102 thereof and the ground electrode, respectively.

As shown in the figure, the ground fault detection device 100 includes a first detection capacitor C1 that operates as a flying capacitor, a second detection capacitor C2 that operates as a flying capacitor, and a control device 110.

In addition, the ground fault detection device 100 includes a positive-electrode-side twin relay St1 at one ends of the first detection capacitor C1 and the second detection capacitor C2 and a negative-electrode-side twin relay St2 at the other ends of the first detection capacitor C1 and the second detection capacitor C2, in order to switch the measurement path and control charging and discharging of the first detection capacitor C1 and the second detection capacitor C2.

The positive-electrode-side twin relay St1 is composed of two C contact switches that operate in conjunction with each other, and is composed of a first a-contact a1, a second a-contact a2, a first b-contact b1, a second b-contact b2, a first c-contact c1, and a second c-contact c2. The positive-electrode-side twin relay St1 switches between a state where the c-contact is in contact with the a-contact (that is, the first c-contact c1 contacts the first a-contact a1 and the second c-contact c2 contacts the second a-contact a2) and a state where the first c-contact is in contact with the b-contact (that is, the first c-contact c1 contacts the first b-contact b1 and the second c-contact c2 contacts the second b-contact b2).

The negative-electrode-side twin relay St2 is composed of two C contact switches that operate in conjunction with each other, and is composed of a third a-contact a3, a fourth a-contact a4, a third b-contact b3, a fourth a b-contact b4, a third c-contact c3, and a fourth c-contact c4. The negative-electrode-side twin relay St2 switches between a state where the c-contact is in contact with the a-contact (that is, the third c-contact c3 contacts the third a-contact a3, and the fourth c-contact c4 contacts the fourth a-contact a4) and a state where the c-contact contacts the b-contact (that is, the third c-contact c3 contacts the third b-contact b3, and the fourth c-contact c4 contacts the fourth b-contact b4).

The first c-contact c1 of the positive-electrode-side twin relay St1 is connected to one end of the first detection capacitor C1 via the switch S1 and the resistor R11, and the third c-contact c3 of the negative-electrode-side twin relay St2 is connected to the other end of the first detection capacitor C1. The second c-contact c2 of the positive-electrode-side twin relay St1 is connected to one end of the second detection capacitor C2 via the switch S2 and the resistor R12, and the fourth c-contact c4 of the negativeelectrode-side twin relay St2 is connected to the other end of the second detection capacitor C2. The switches S1 and S2 can be composed of insulating switching elements such as optical MOSFETs.

The first a-contact a1 of the positive-electrode-side twin relay St1 is connected to the positive-electrode-side power supply line 101 via resistors Ra1 and Ra2, and the second a-contact a2 of the positive-electrode-side twin relay St1 is connected to the positive-electrode-side power supply line 101 via the resistor Ra1. The third a-contact a3 of the negative-electrode-side twin relay St2 is connected to the negative-electrode-side power supply line 102 via resistors Rb1 and Rb2, and the fourth a-contact point a4 of the negative-electrode-side twin relay St2 is connected to the negative-electrode-side power supply line 101 via the resistor Rb1.

The first b-contact b1 of the positive-electrode-side twin relay St1 is connected to a first measuring resistor R21 whose other end is grounded, and the control device 110 is connected to a line connecting the first b-contact b1 and the first measuring resistor R21 of the positive-electrode-side twin relay St1. The second b-contact b2 of the positive-electrode-side twin relay St1 is connected to a second measuring resistor R22 whose other end is grounded, and the control device 110 is connected to a line connecting the second b-contact b2 and the second measuring resistor R22 of the positive-electrode-side twin relay St1. The third b-contact b3 of the negative-electrode-side twin relay St2 is connected to a resistor R31 whose other end is grounded, and the fourth b-contact point b4 of the negative-electrode-side twin relay St2 is connected to a resistor R32 whose other end is grounded.

The control device 110 is configured by a microcomputer and the like, and executes various programs required by the ground fault detection device 100 by executing the program incorporated in advance. Specifically, the positive-electrode-side twin relay St1, the negative-electrode-side twin relay St2, the switches S1 and S2 are individually controlled to switch the measurement path, and the first detection capacitor C1 and the second detection capacitor C2 are controlled to be charged and discharged.

Further, the control device 110 inputs an analog level corresponding to a charging voltage of the first detection capacitor C1 and the second detection capacitor C2, and based on this analog level, detects a decrease in insulation resistance in a system where the high voltage battery 300 is provided.

Further, in the present embodiment, a positive-electrode-side short circuit resistor R41 whose other end is grounded is connected to the positive-electrode-side power supply line 101 via the switch S31. Further, a negative-electrode-side short-circuit resistor R42 whose other end is grounded is connected to the negative-electrode-side power supply line 102 via the switch S32. The switches S31 and S32 are controlled by the control device 110. Considering safety, the resistance values of the short-circuit resistors R41 and R42 may be set to the same level as the insulation resistance value, for example.

<Control when Y Capacitor is not Large Capacitance>

In the present embodiment, the ground fault detection method is changed according to capacitance of the Y capacitor. Therefore, in the present embodiment, the detection capacitor used when detecting the ground fault is changed according to the capacitance of the Y capacitor. For example, when a ratio of the capacitance of the Y capacitor to the first detection capacitor C1 is smaller than a predetermined value, and an influence on a measurement value of a charge accumulated in the Y capacitor transferring to the detection capacitor is small, as shown in FIG. 1, the control device 110 turns on the switch S1 and turns off the switch S2. That is, in the present embodiment, when the Y capacitor having a large capacitance is connected, the first detection capacitor C1 are used to detect the ground fault by a first system including the high voltage battery 300, the first detection capacitor C1, the control device 110, and the twin relays St1 and St2.

In the present embodiment, when the Y capacitor having not a large capacitance is connected, the ground fault is detected in the conventional method. Specifically, in order to grasp the insulation resistors RLp and RLn, the measurement operation is repeated with the V0 measurement period→Vc1n measurement period→V0 measurement period→Vc1p measurement period as one cycle. In any measurement period, the detection capacitor C1 is charged with the voltage to be measured, and then the charging voltage of the first detection capacitor C1 is measured. Then, the first detection capacitor C1 is discharged for the next measurement. At this time, for example, a time for which the detection capacitor C1 is charged by about 50% is set as charging time of each measurement period so that the detection capacitor C1 is not fully charged. In addition, the switches S31 and S32 remain off during any measurement period.

During the V0 measurement period, the voltage corresponding to the high voltage battery 300 voltage is measured. Therefore, both the positive-electrode-side twin relay St1 and the negative-electrode-side twin relay St2 are switched to the a-contact side to charge the first detection capacitor C1. That is, the high voltage battery 300, the resistors Ra1, Ra2, R11, the first detection capacitor C1, and the resistors Rb1, Rb2 serve as a measurement path.

When measuring the charging voltage of the first detection capacitor C1, both the positive-electrode-side twin relay St1 and the negative-electrode-side twin relay St2 are switched to the b-contact side, and the control device 110 performs sampling. After that, the first detection capacitor C1 is discharged for the next measurement. The operation at the time of measuring the charging voltage of the first detection capacitor C1 and the operation at the time of discharging the first detection capacitor C1 are the same in other measurement periods.

During the Vc1n measurement period, the voltage that reflects the influence of the insulation resistor RLn is measured. Therefore, the positive-electrode-side twin relay St1 is switched to the a-contact side and the negative-electrode-side twin relay St2 is switched to the b-contact side to charge the first detection capacitor C1. That is, the high voltage battery 300, the resistors Ra1, Ra2, R11, the first detection capacitor C1, the resistor R31, the ground, and the insulation resistor RLn serve as a measurement path.

During the Vc1p measurement period, the voltage that reflects the influence of the insulation resistor RLp is measured. Therefore, the positive-electrode-side twin relay St1 is switched to the b-contact side and the negative-electrode-side twin relay St2 is switched to the a-contact side to charge the first detection capacitor C1. That is, the high voltage battery 300, the insulation resistor RLp, the ground, the resistors R21, R11, the first detection capacitor C1, and the resistors Rb2, Rb1 serve as a measurement path.

It is known that $(RLp \times RLn)/(RLp+RLn)$ can be obtained based on $(Vc1p+Vc1n)/V0$ calculated from V0, Vc1n, and Vc1p obtained during these measurement periods. Therefore, the control device 110 in the ground fault detection device 100 can grasp the combined resistor of the insulation resistors RLp, RLn by measuring V0, Vc1n, and Vc1p. Then, when the combined resistor of the insulation resistors RLp and RLn becomes equal to or lower than a predetermined determination reference level, it is determined that a ground fault has occurred and an alarm is output.

<Control when Y Capacitor has Large Capacitance>

When the high voltage battery 300 is connected to high voltage equipment such as charging equipment, the large capacitance Y capacitor is connected. When the large capacitance Y capacitor is connected, the electric charge accumulated in the Y capacitor transfers to the detection capacitor, which affects the measurement value when each measuring in a ground fault detection device 400.

Therefore, in the present embodiment, for example, when the ratio of the capacitance of the Y capacitor to the first detection capacitor C1 is larger than a predetermined value, and influence to the measured value is not small such that the electric charge accumulated in the Y capacitor is transferred to the detection capacitor C1, the ground fault is detected in a method different from the above-mentioned conventional method. At this time, in the present embodiment, as shown in FIGS. 3-6, the control device 110 turns off the switch S1 and turns on the switch S2. That is, in the present embodiment, when the large capacitance Y capacitor is connected, the ground fault detection is performed by a second measurement system including the high voltage battery 300, the second detection capacitor C2, the control device 110, and the twin relays St1, St2 using the second detection capacitor C2. The switches S1 and S2 function as a switching unit that switches between a state in which the first measurement system is used and a state in which the second measurement system is used.

When a charging facility is connected to the high voltage battery 300, a signal indicating the connection is output from the charging facility. Therefore, for example, the control device 110, when receiving this signal, may determine that the large capacitance Y capacitor is connected, turn off the switch S1 and turn on the switch S2.

In this embodiment, the second detection capacitor C2 is measured in a fully charged state. Therefore, in the present embodiment, in order to shorten the charging time, for example, the capacitance of the second detection capacitor C2 is made smaller than the capacitance of the first detection capacitor C1. As will be described below, in the present embodiment, the second detection capacitor C2 does not need to have a large capacitance even when a large capacitance Y capacitor (CYp, CYn) is connected, shortening the full charging time. Further, since the partial voltage value by the resistor of the high voltage battery 300 is measured, it is not necessary to wait for the Y capacitor to stabilize.

The operation of the ground fault detection device 100 when the large capacitance Y capacitor is connected (that is, when the switch S1 is turned off and the switch S2 is turned on) will be described with reference to a flowchart of FIG. 2. As described above, in the present embodiment, the second detection capacitor C2 is measured in the fully charged state, and the ground fault is determined in a method different from the conventional insulation resistance calculation.

Figure 3A:
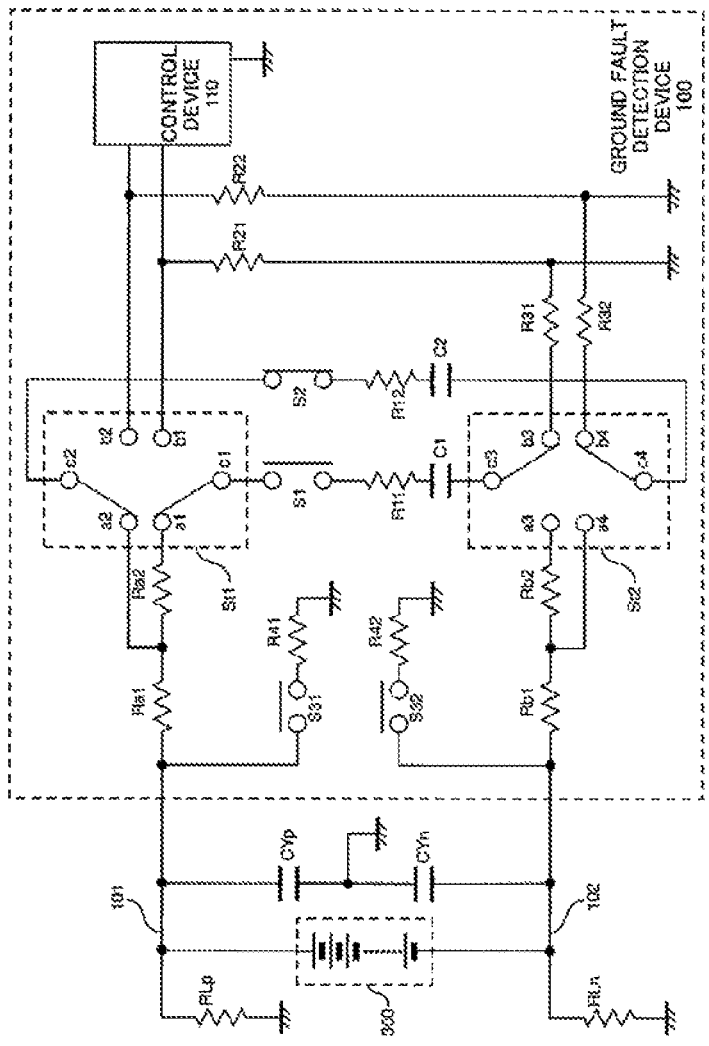
FIGS. 3A-3B are diagrams illustrating Vp measurement.

First, as shown in FIG. 3A, the positive-electrode-side twin relay St1 is switched to the a-contact side, the negative-electrode-side twin relay St2 is switched to the b-contact side, and the second detection capacitor C2 is fully charged with the switches S31 and S32 turned off. After that, by switching the positive-electrode-side twin relay St1 to the b-contact side, the charging voltage Vp when the detection capacitor C2 is fully charged is measured (S101).

Figure 3B:
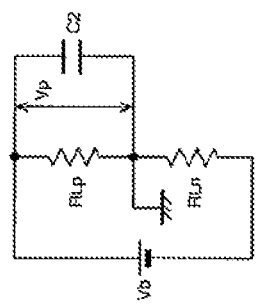

Here, the charging voltage Vp corresponds to the voltage generated in the resistor RLp when the voltage Vb of the high voltage battery 300 is divided by the resistors RLp and RLn, as shown in FIG. 3(b).

Figure 4A:
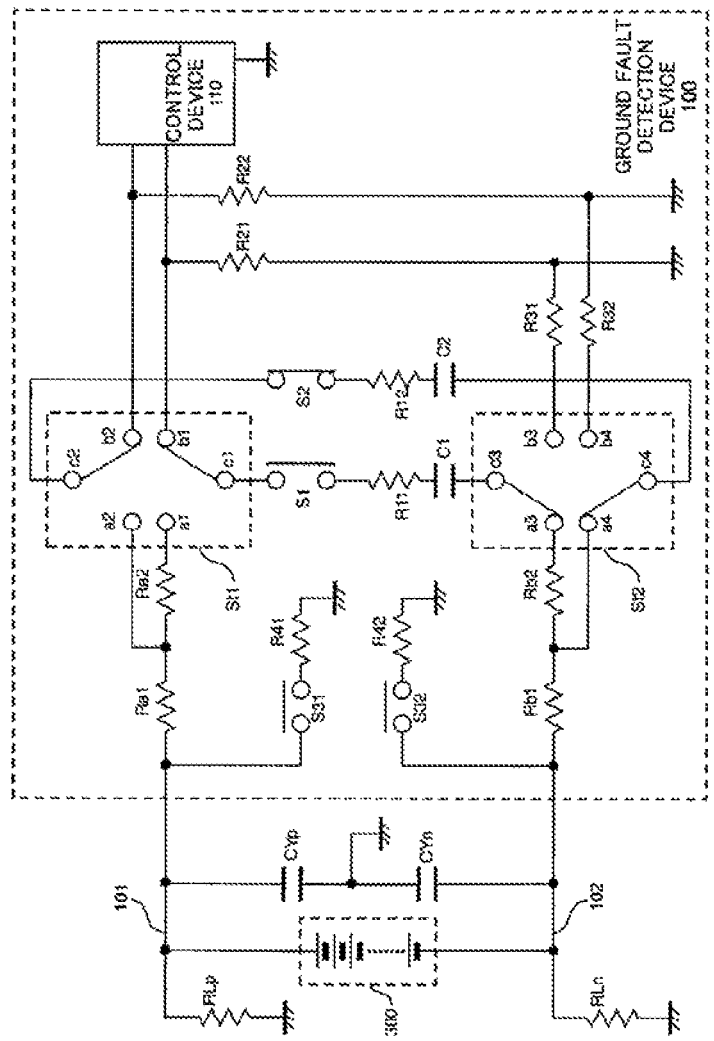
FIGS. 4A-4B are diagrams illustrating Vn measurement.

Next, as shown in FIG. 4A, the positive-electrode-side twin relay St1 is switched to the b-contact side, the negative-electrode-side twin relay St2 is switched to the a-contact side, and the second detection capacitor C2 is fully charged with the switches S31 and S32 turned off. After that, the negative-electrode-side twin relay St2 is switched to the b-contact side to measure the charging voltage Vn when the detection capacitor C2 is fully charged (S102).

Figure 4B:
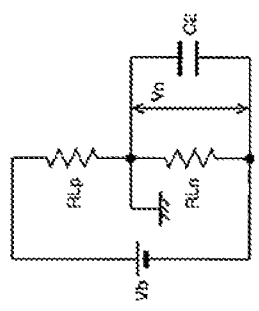

Here, the charging voltage Vn corresponds to a voltage generated in the resistor Rn when the voltage Vb of the high voltage battery 300 is divided by the resistors Rp and Rn, as shown in FIG. 4B. The order of measuring the charging voltage Vn and the charging voltage Vp does not matter.

When the charging voltage Vp is smaller than the charging voltage Vn (S103: Yes), it is determined that the positive-electrode-side insulation resistor RLp has decreased (S105) if the degree of the smallness is larger than a predetermined reference, for example, Vn/Vp>reference value P (S104: Yes).

It follows from this that the charging voltage Vp being smaller than the charging voltage Vn means that the positive-electrode-side insulation resistor RLp is smaller than the negative-electrode-side insulation resistor RLn because it is considered that the higher the degree, the lower the positive-electrode-side insulation resistor RLp.

Similarly, when the charging voltage Vn is smaller than the charging voltage Vp (S103: No), it is determined that the negative-electrode-side insulation resistor RLn has decreased (S111) if the degree of the smallness is larger than a predetermined reference, for example, if Vp/Vn>reference value P (S110: Yes).

Figure 5A:
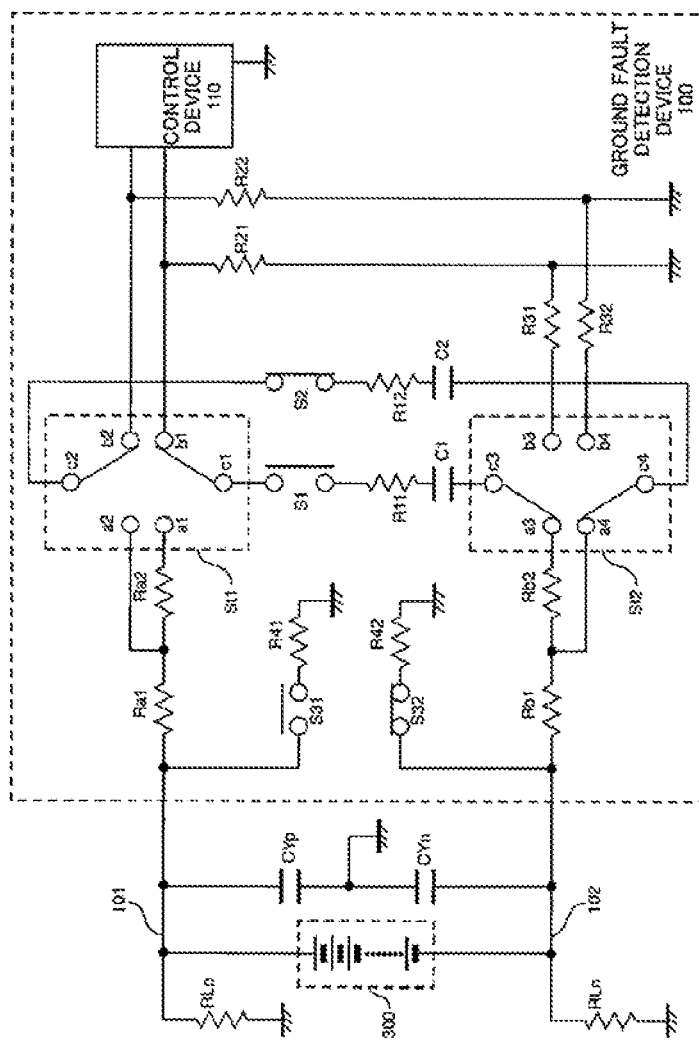
FIGS. 5A-5B are diagrams illustrating Vp' measurement.

When the difference between the charging voltage Vp and the charging voltage Vn is relatively small, it is highly likely that both the positive-electrode-side insulation resistor RLp and the negative-electrode-side insulation resistor RLn are normal, but there is a small possibility that the resistor RLn and the resistor RLn have decreased to the same level. Therefore, when the charging voltage Vp is smaller than the charging voltage Vn (S103: Yes) and the difference between the charging voltage Vp and the charging voltage Vn is relatively small, for example, when Vn/Vp reference value P (S104: No), as shown in FIG. 5A, the second detection capacitor C2 is fully charged while the positive-electrode-side twin relay St1 is switched to the b-contact side, the negative-electrode-side twin relay St2 is switched to the a-contact, the switch S31 is turned off, and the switch S32 is turned on. After that, the negative-electrode-side twin relay St2 is switched to the b-contact side to measure the charging voltage Vn' when the detection capacitor C2 is fully charged (S106).

Figure 5B:
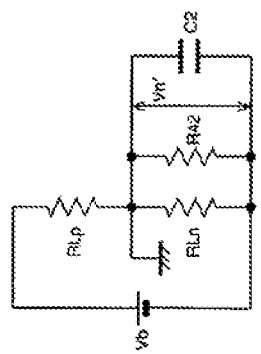

Here, as shown in FIG. 5B, the charging voltage Vn' corresponds to the voltage generated in the parallel combined resistor of the resistor RLn and the short-circuit resistor R42 when the voltage Vb of the high voltage battery 300 is divided by the resistor RLp and a parallel combined resistor of the resistor RLn and the negative-electrode-side short-circuit resistor R42.

When the charging voltage Vn and the charging voltage Vn' can be regarded as substantially the same, for example, when the rate of change (Vn/Vn') from the charging voltage Vn to the charging voltage Vn is smaller than the reference value (S107: Yes), since the influence of the inserted negative-electrode-side short-circuit resistor R42 is small, it is determined that both the positive-electrode-side insulation resistor RLp and the negative-electrode-side insulation resistor RLn have decreased (S109).

On the other hand, when the charging voltage Vn and the charging voltage Vn' cannot be regarded as substantially the same, for example, when the rate of change from the charging voltage VVn to the charging voltage Vn is larger than the reference value (S107: No), since the influence of the inserted negative-electrode-side short-circuit resistor R42 is great, it is determined that neither the positive-electrode-side insulation resistor RLp nor the negative-electrode-side insulation resistor RLn has decreased, and that they are normal (S108).

Figure 6A:
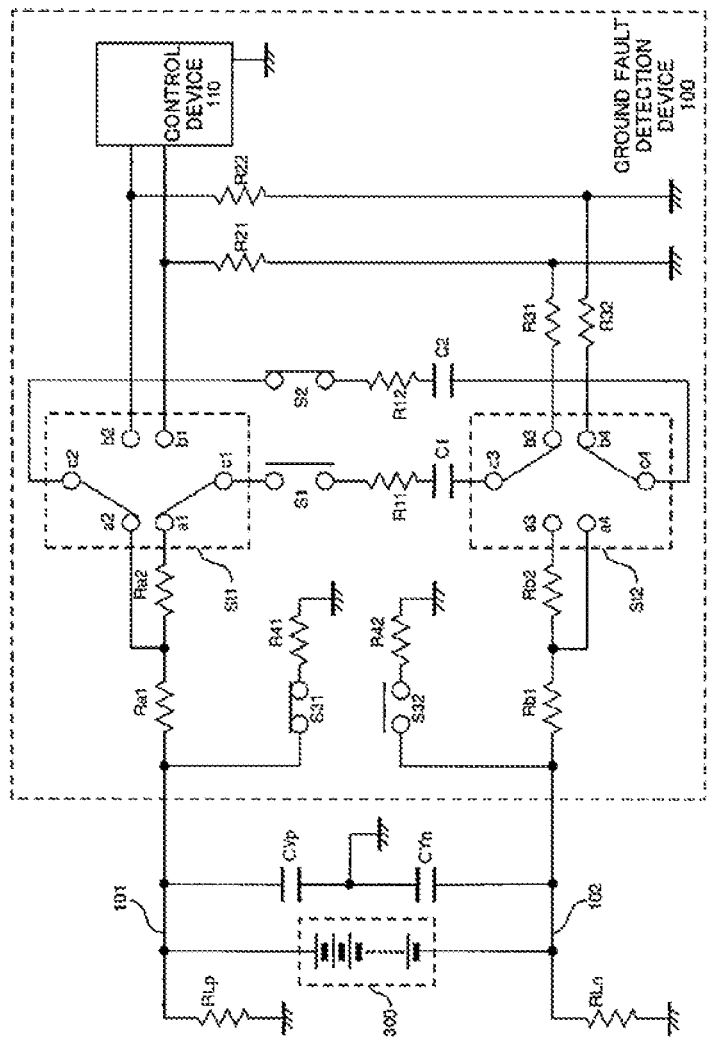
FIGS. 6A-6B are diagrams illustrating Vn' measurement.

Similarly, when the charging voltage Vn is higher than the charging voltage Vp (S103: No) and the difference between the charging voltage Vp and the charging voltage Vn is relatively small, for example, when Vp/Vn<reference value P (S110: No), the second detection capacitor C2 is fully charged, as shown in FIG. 6A, while the positive-electrode-side twin relay St1 is switched to the a-contact side, the negative-electrode-side twin relay St2 is switched to the b-contact side, the switch 31 turned on, and the switch 32 turned off. After that, the charging voltage Vp' when the detection capacitor C2 is fully charged is measured by switching the positive-electrode-side twin relay St1 to the b-contact side (S112).

Figure 6B:
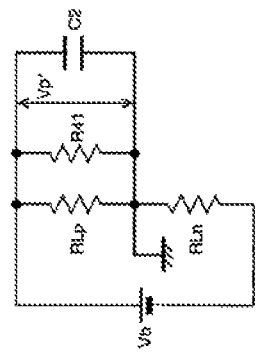

Here, as shown in FIG. 6B, the charging voltage Vp' corresponds to a voltage generated in the parallel combined resistor of the resistor RLp and the positive-electrode-side short circuit resistor R41 when the voltage Vb of the high voltage battery 300 is divided by a parallel combined resistor of the resistor RLp and the positive-electrode-side short circuit resistor R41 and the resistor RLn.

When the charging voltage Vp and the charging voltage Vp' can be regarded as substantially the same, for example, when the rate of change (Vp/Vp') from the charging voltage Vp to the charging voltage Vp' is smaller than the reference value (S107: Yes). Since the influence of the inserted positive-electrode-side short circuit resistor R41 is small, it is determined that both the positive-electrode-side insulation resistor RLp and the negative-electrode-side insulation resistor RLn have decreased (S114).

On the other hand, when the charging voltage Vp and the charging voltage Vp' cannot be regarded as substantially the same, for example, when the rate of change from the charging voltage Vp to the charging voltage Vp' is larger than the reference value (S113: No), since the influence of the inserted positive-electrode-side short circuit resistor R41 is large, it is determined that neither the positive-electrode-side insulation resistor RLp nor the negative-electrode-side insulation resistor RLn has decreased, and that they are normal (S108).

In the above example, when the difference between the charging voltage Vp and the charging voltage Vn is relatively small, the charging voltage Vn' is measured if the charging voltage Vp is smaller, and the charging voltage Vp' is measured if the charging voltage Vn is smaller. It follows from this that the rate of change in charging voltage when the resistor (positive-electrode-side short circuit resistor R41 or negative-electrode-side short-circuit resistor R42) is connected in parallel with the larger one of the positive-electrode-side insulation resistor RLp and the negative-electrode-side insulation resistor RLn. However, irrespective of the magnitude relationship between the charging voltage Vp and the charging voltage Vn, when the relative difference is small, either the charging voltage Vp' or the charging voltage Vn' may be measured to determine that the insulation of both electrodes is decreased or normal.

<Other Embodiments of Ground Fault Detection Device 100>

Figures 7A, 7B:
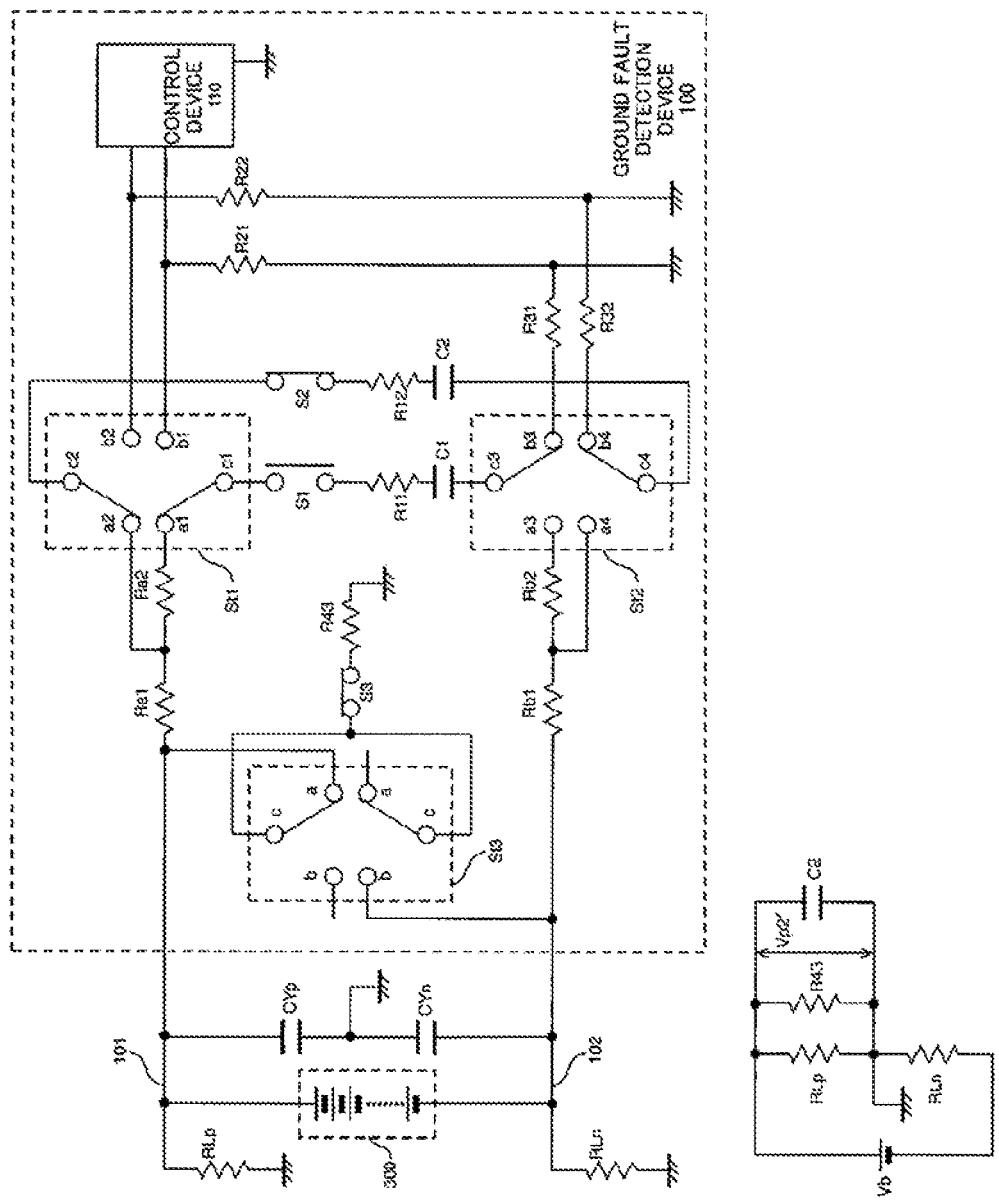
FIGS. 7A-7B are diagrams illustrating Vp2' measurement.
Figure 8A:
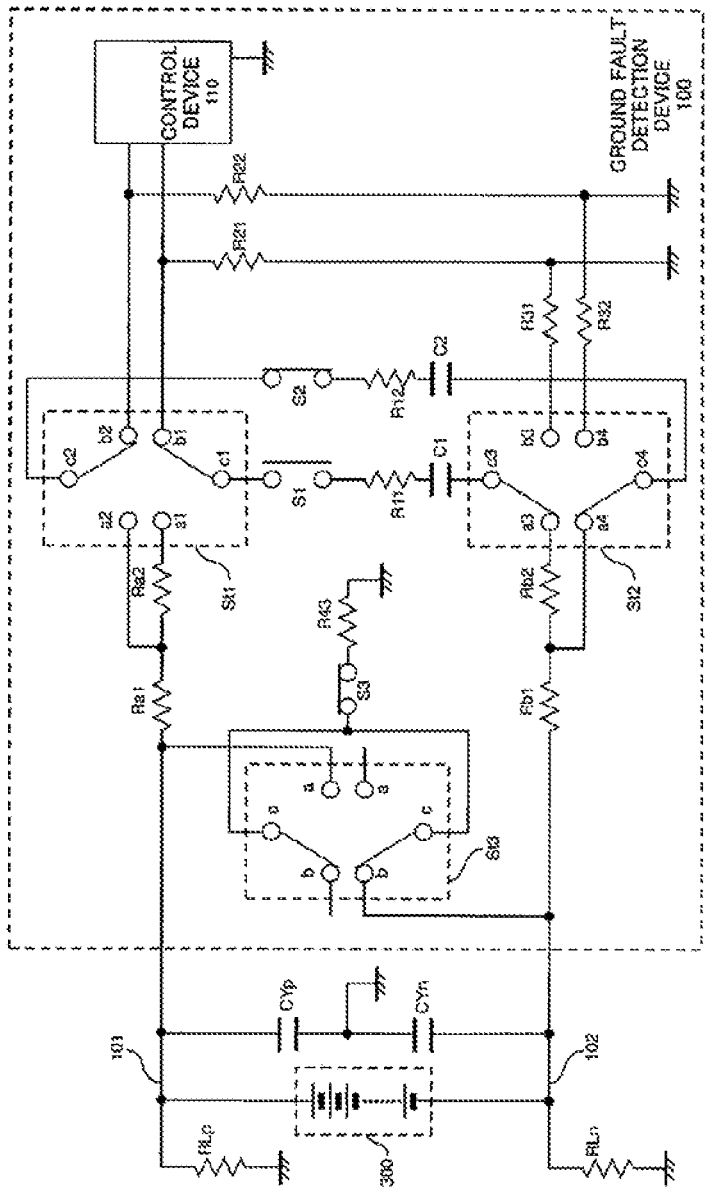
FIGS. 8A-8B are diagrams illustrating Vn2' measurement.
Figure 8B:
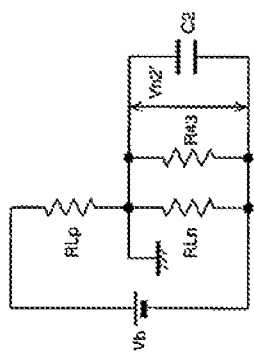

As shown in FIGS. 7 and 8, the ground fault detection device 100 may include a twin relay St3, a switch S3, and a short circuit resistor R43 instead of the switches S31 and 32 and the short circuit resistors R41 and 42. In this case, as shown in FIG. 7, while the positive-electrode-side twin relay St1 is switched to the a-contact side, the negative-electrode-side twin relay St2 is switched to the b-contact side, the twin relay St3 is switched to the a-contact side, and the switch S3 is turned on, the second detection capacitor C2 is fully charged, measuring the charging voltage Vp2' influenced by the short-circuit resistor R43. In addition, as shown in FIG. 8, while the positive-electrode-side twin relay St1 is switched to the b-contact side, the negative-electrode-side twin relay St2 is switched to the a-contact side, the twin relay St3 is switched to the b-contact side, and the switch S3 is turned on, the second detection capacitor C2 is fully charged, measuring the charging voltage Vn2' influenced by the short-circuit resistor R43. In the above method, using the charging voltage Vp2' instead of the charging voltage Vp', and the charging voltage Vn2' instead of the charging voltage Vn', it may be determined that both the positive-electrode-side insulation resistor RLp and the negative-electrode-side insulation resistor RLn have been decreased. In the embodiment of FIGS. 7 and 8, instead of the twin relay St3, a C contact switch may be used in which the a-contact is connected to the positive power supply line 101, the b-contact is connected to the negative power supply line 102, and the c-contact is connected to the switch S3.

Figure 9A:
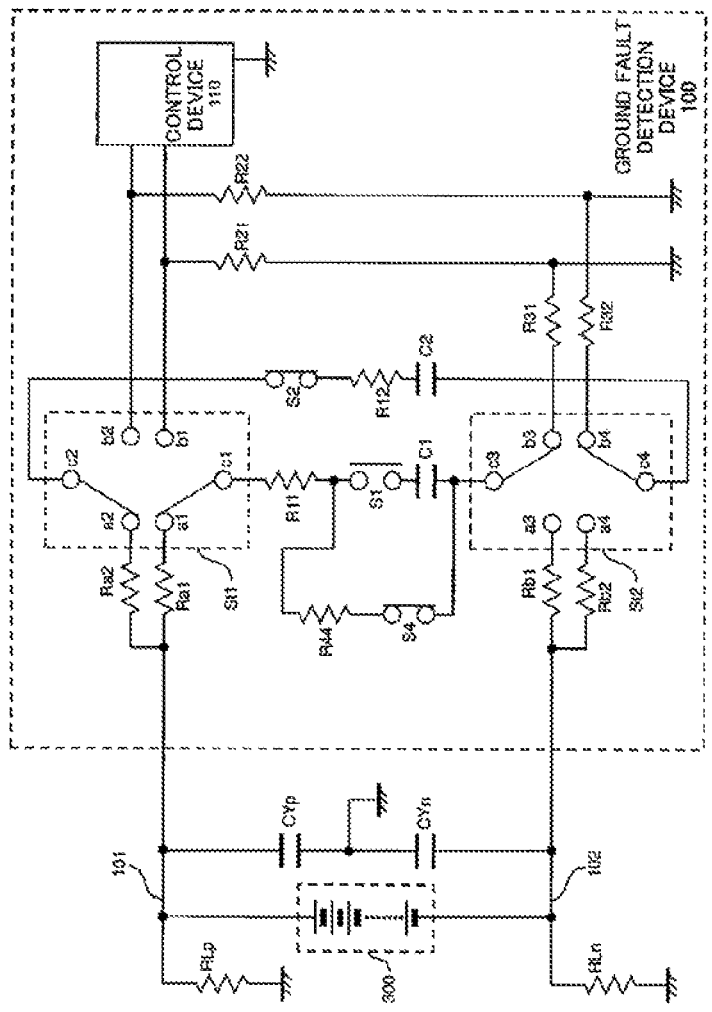
FIGS. 9A-9B are diagrams explaining Vp3' measurement.
Figure 9B:
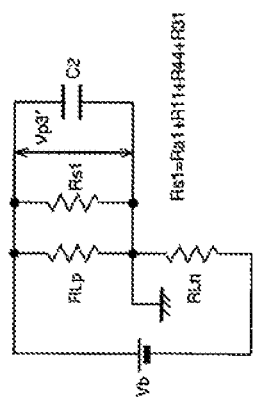
Figure 10A:
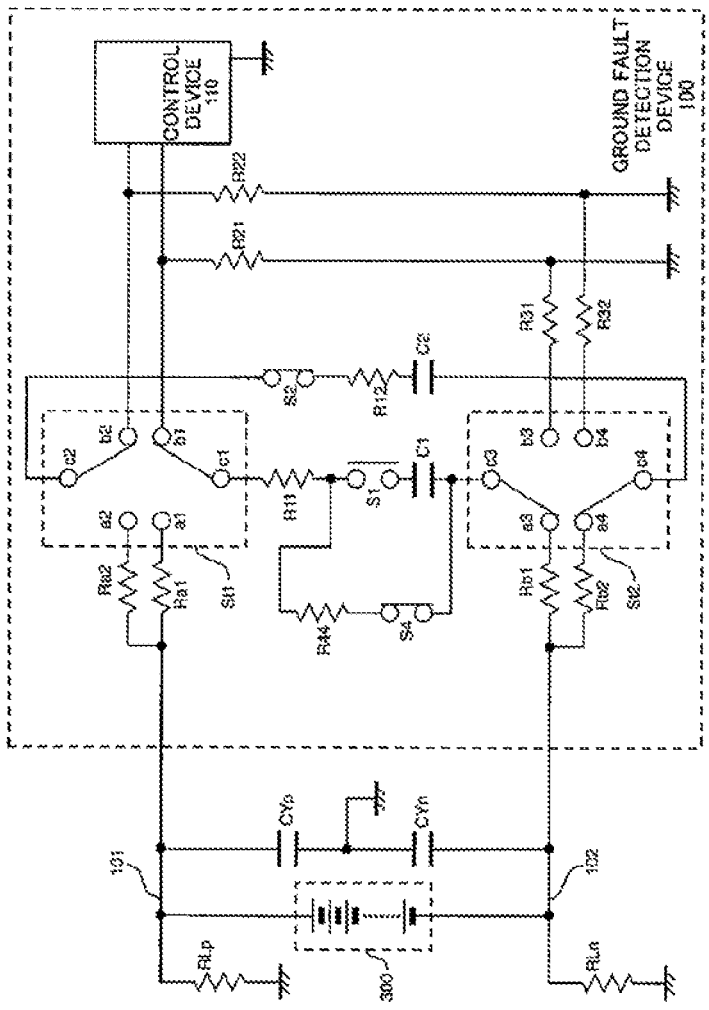
FIGS. 10A-10B are diagrams explaining Vn3' measurement.
Figure 10B:
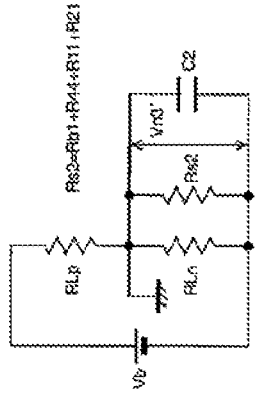

Further, as shown in FIGS. 9 and 10, the ground fault detection device 100 may include a switch 4 and a short circuit resistor R44 instead of the switches S31 and 32 and the short circuit resistors R41 and 42. In this case, as shown in FIG. 9, while the positive-electrode-side twin relay St1 is switched to the a-contact side, the negative-electrode-side twin relay St2 is switched to the b-contact side, and the switch S4 turned on, the second detection capacitor C2 is fully charged, measuring the charging voltage Vp3' influenced by the short-circuit resistor R44 and the like. As shown in FIG. 10, while the positive-electrode-side twin relay St1 is switched to the b-contact side, the negative-electrode-side twin relay St2 is switched to the a-contact, and the switch S4 is turned on, the second detection capacitor C2 is fully charged, measuring the charging voltage Vn3' influenced by the short-circuit resistor R44 and the like. Then, in the above-described method, using the charging voltage Vp3' in place of the charging voltage Vp', and the charging voltage Vn3' in place of the charging voltage Vn', it may be determined that both the positive-electrode-side insulation resistor RLp and the negative-electrode-side insulation resistor RLn have been decreased.

<High-Speed Measurement of Vp>

Figure 11:
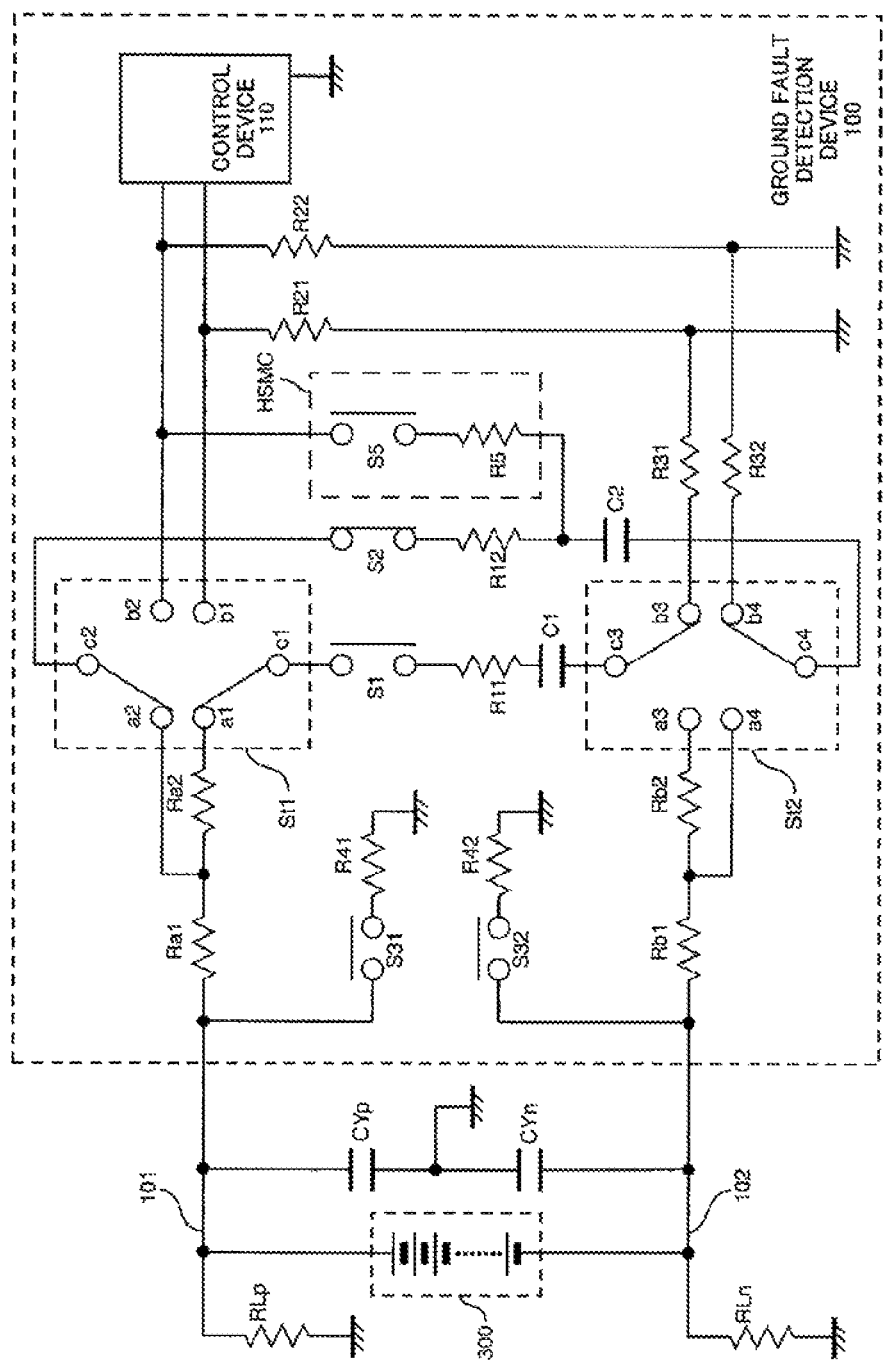
FIG. 11 is a diagram illustrating high-speed measurement of Vp.
Figure 12:
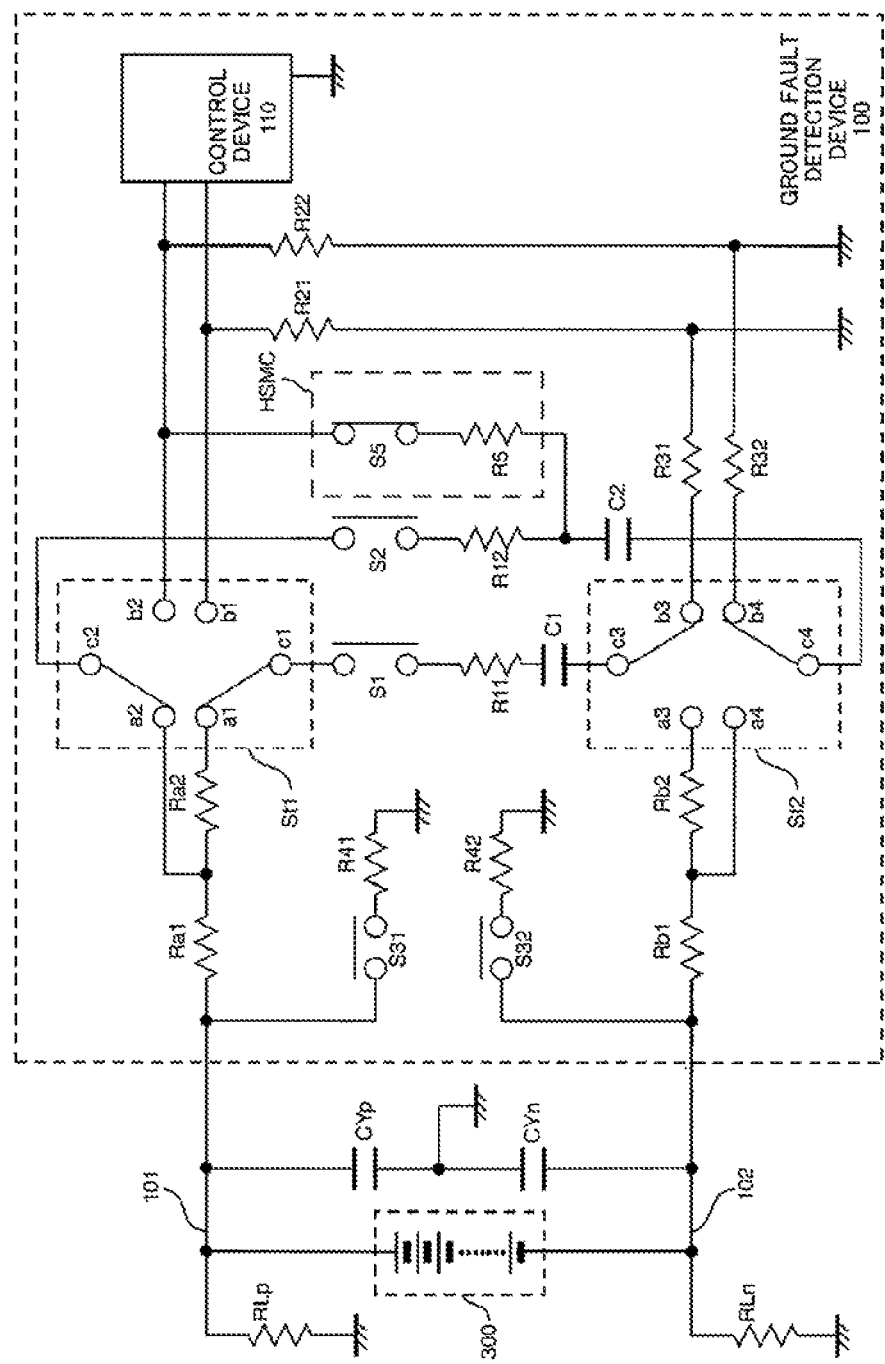
FIG. 12 is a diagram illustrating high-speed measurement of Vp.

As shown in FIGS. 11 and 12, a high-speed measurement circuit HSMC including a switch S5 composed of an insulation type switching element such as an optical MOSFET and a resistor R5 is provided between a positive-electrode plate of the second detection capacitor C2 and the second b-contact b2, measuring the charging voltage Vp without operating the positive-electrode-side twin relay St1.

In the method described above, as shown in FIG. 3A, the second detection capacitor C2 is fully charged while the positive-electrode-side twin relay St1 is switched to the a-contact side, the negative-electrode-side twin relay St2 is switched to the b-contact side, the switch S2 is turned on, and the switches S1, S31, S32 are turned on. After that, the charging voltage Vp when the detection capacitor C2 is fully charged is measured by switching the positive-electrode-side twin relay St1 to the b-contact side.

On the other hand, in the ground fault detection device 100 shown in FIGS. 11 and 12, as shown in FIG. 11, the second detection capacitor C2 is fully charged while the positive-electrode-side twin relay St1 is switched to the a-contact side, the negative-electrode-side twin relay St2 is switched to the b-contact side, and the switch S2 is turned on, and the switches S1, S31, S32, and S5 turned off. Thereafter, as shown in FIG. 12, the switch S2 is turned off and the switch 5 is turned on to measure the charging voltage Vp when the detection capacitor C2 is fully charged.

As described above, in the ground fault detection device 100 shown in FIGS. 11 and 12, after the detection capacitor C2 is fully charged, the positive-electrode-side twin relay St1 is not switched, but the switches S2 and S5 are switched. In general, the optical MOSFET can switch at a higher speed than a relay. Therefore, the ground fault detection device 100 shown in FIGS. 11 and 12 can measure Vp at high speed. In addition, by switching the switches S2 and S5 instead of switching the positive-electrode-side twin relay St1, it is possible to suppress the number of times the positive-electrode-side twin relay St1 is opened and closed, and extend the life of the positive-electrode-side twin relay St1. Further, since the positive-electrode-side twin relay St1 is not switched, it is possible to reduce generation of noise by operating the positive-electrode-side twin relay St1.

Figure 13:
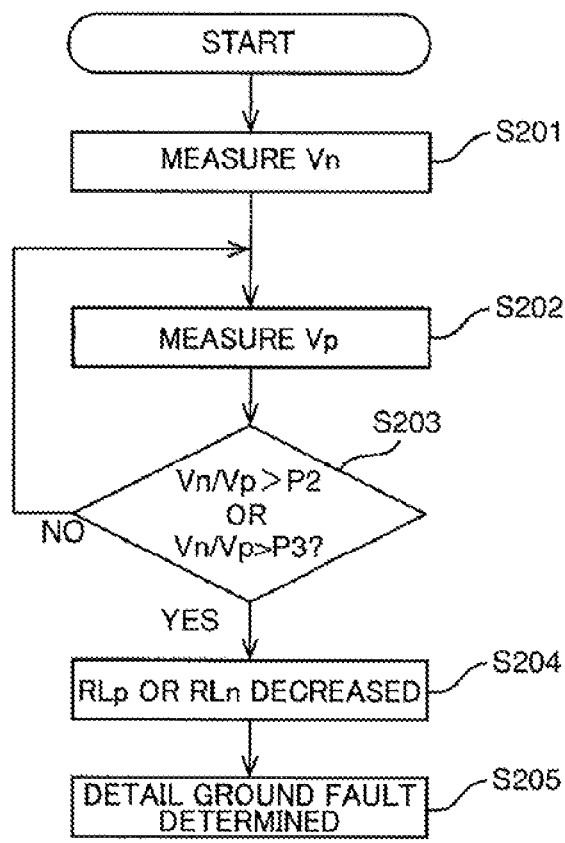
FIG. 13 is a flowchart explaining an operation of the ground fault detection device.
Figure 14:
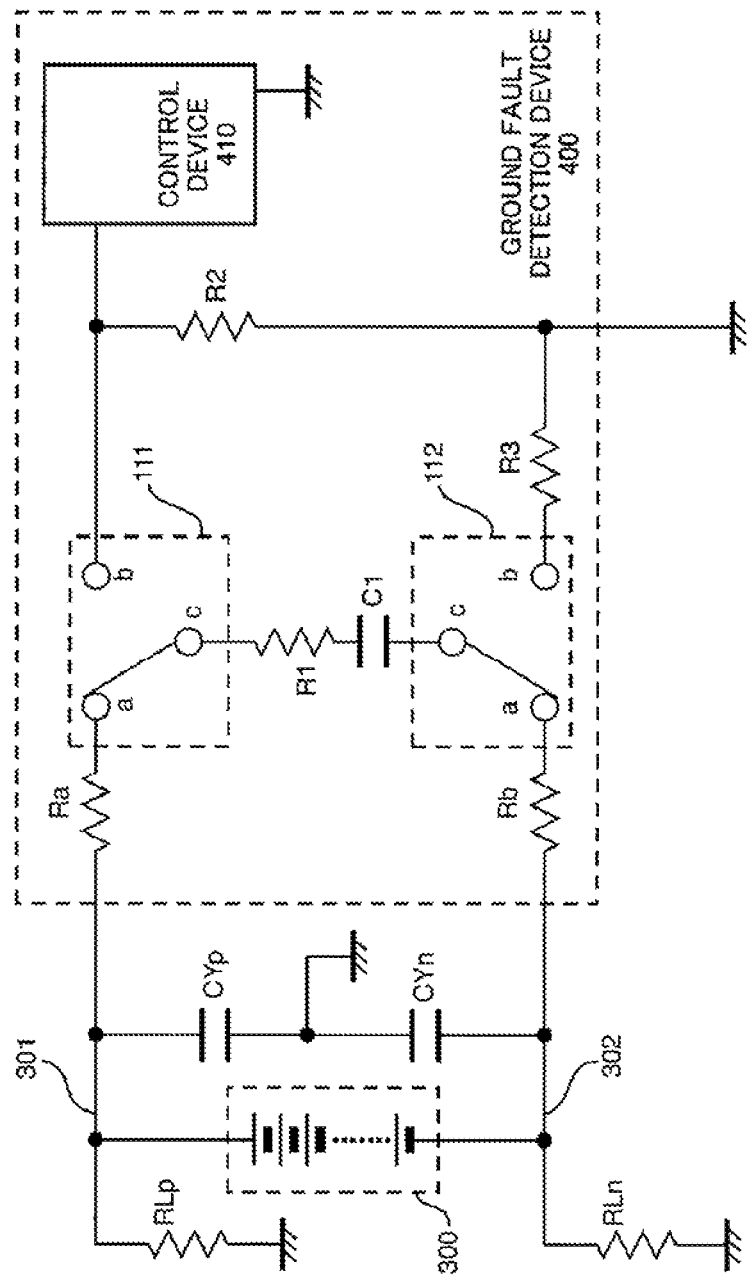
FIG. 14 is a diagram showing a circuit example of a conventional ground fault detection device of a flying capacitor system.

In the ground fault detection device 100 shown in FIGS. 11 and 12, it is preferable to detect the ground fault as shown in the flowchart of FIG. 13, for example. First, the voltage Vn is measured (S201) in a method similar to step S102 of the flowchart of FIG. 2 described above.

After step S201, as shown in FIG. 11, the second detection capacitor C2 is fully charged while the positive-electrode-side twin relay St1 is switched to the a-contact side, the negative-electrode-side twin relay St2 is switched to the b-contact side, the switch S2 is turned on, and the switches S1, S31, S32, and S5 are turned on, and then the switch S2 is turned off and the switch 5 is turned on as shown in FIG. 12 to measure the voltage Vp (S202).

Figure 2:
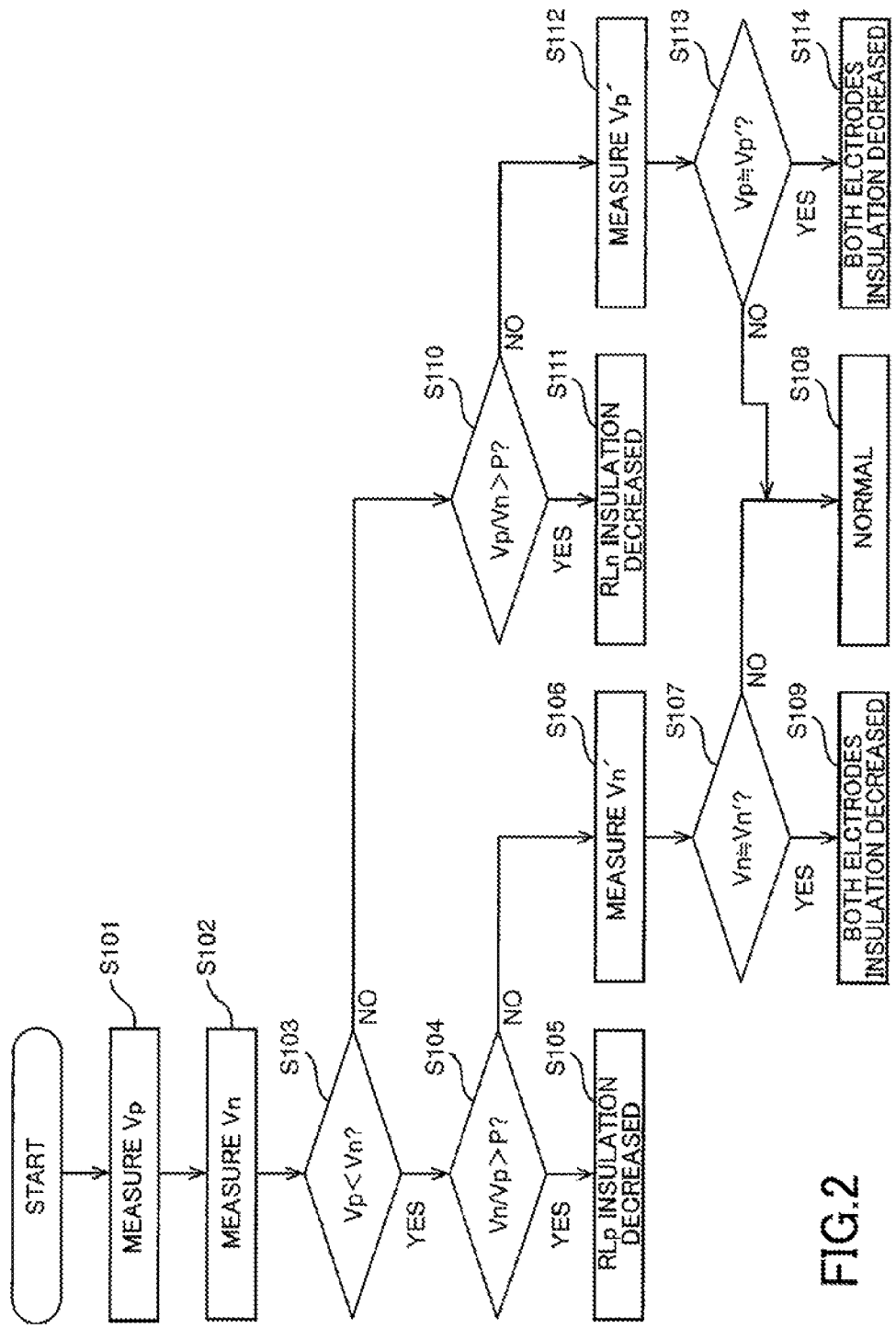
FIG. 2 is a flowchart explaining operation of the ground fault detection device.

When the voltage Vn and the voltage Vp are compared, and the difference in magnitude between the voltage Vn and the voltage Vp is larger than a predetermined reference, for example, when Vp/Vn>reference value P2 or Vn/Vp>reference value P3 (S203, YES), it is determined that the positive-electrode-side insulation resistor RLp or the negative-electrode-side insulation resistor RLn has decreased (S204), and then the detailed ground fault determination as described above is performed according to the flowchart of FIG. 2 (S205). If the difference between the voltage Vn and the voltage Vp is not larger than the predetermined reference (S203, NO), the voltage Vp is measured again (S202). This makes it possible to determine the occurrence of the ground fault without opening and closing the positive-electrode-side twin relay St1 until the difference between the voltage Vn and the voltage Vp becomes larger than the predetermined reference. The voltage Vn may be appropriately measured if necessary.

REFERENCE SIGNS LIST 100 ground fault detection device
101 positive-side power supply line
102 negative-side power line
110 control device
300 high voltage battery
C1 first detection capacitor
C2 second detection capacitor
CYp Y capacitor
CYn Y capacitor
RLn negative-electrode-side insulation resistor
RLp positive-electrode-side insulation resistor

What is claimed is:

1. A ground fault detection device which is connected to a high voltage battery and detects a decrease in insulation resistance of a system provided with the high voltage battery, the ground fault detection device comprising:
   a first detection capacitor that operates as a flying capacitor;
   a second detection capacitor that operates as a flying capacitor;
   a control unit that measures charging voltages of the first detection capacitor and the second detection capacitor; and
   a switching unit that switches between a state using a first measurement system in which the first detection capacitor is charged with the high voltage battery and the charging voltage of the first detection capacitor is measured by the control unit, and a state using a second measurement system in which the second detection capacitor is charged with the high voltage battery and the charging voltage of the second detection capacitor is measured by the control unit.

2. The ground fault detection device according to claim 1, wherein
   a capacitance of the second detection capacitor is smaller than a capacitance of the first detection capacitor, and wherein
   in the second measurement system, the second detection capacitor is fully charged with the high voltage battery, and the charging voltage of the second detection capacitor is measured by the control unit.

3. The ground fault detection device according to claim 1, further comprising:
   a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected;
   a negative-electrode-side twin relay including a first negative-electrode-side C contact switch for switching between a battery negative-electrode-side contact and a ground-side contact, and a second negative-electrode-side C contact switch for switching between the battery negative-electrode-side contact and a ground-side contact;
   a first switch connected in series with the first detection capacitor between a common contact of the first positive-electrode-side C contact switch and a common contact of the first negative-electrode-side C contact switch;
   a second switch connected in series with the second detection capacitor between a common contact of the second positive-electrode-side C contact switch and a common contact of the second negative-electrode-side C contact switch;

a third switch connected in series with a positive-electrode-side short circuit resistor between a battery positive-electrode-side and ground; and a fourth switch connected in series with a negative-electrode-side short-circuit resistor between a battery negative-electrode-side and the ground, wherein the switching unit includes the first switch and the second switch, and wherein the control unit controls operations of the positive-electrode-side twin relay, the negative-electrode-side twin relay, the first switch, the second switch, the third switch, and the fourth switch, and detects a decrease in insulation resistance based on a voltage generated in the first measurement resistor or the second measurement resistor.

4. The ground fault detection device according to claim 2, further comprising:

a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected;

a negative-electrode-side twin relay including a first negative-electrode-side C contact switch for switching between a battery negative-electrode-side contact and a ground-side contact, and a second negative-electrode-side C contact switch for switching between the battery negative-electrode-side contact and a ground-side contact;

a first switch connected in series with the first detection capacitor between a common contact of the first positive-electrode-side C contact switch and a common contact of the first negative-electrode-side C contact switch;

a second switch connected in series with the second detection capacitor between a common contact of the second positive-electrode-side C contact switch and a common contact of the second negative-electrode-side C contact switch;

a third switch connected in series with a positive-electrode-side short circuit resistor between a battery positive-electrode-side and ground; and a fourth switch connected in series with a negative-electrode-side short-circuit resistor between a battery negative-electrode-side and the ground, wherein the switching unit includes the first switch and the second switch, and wherein the control unit controls operations of the positive-electrode-side twin relay, the negative-electrode-side twin relay, the first switch, the second switch, the third switch, and the fourth switch, and detects a decrease in insulation resistance based on a voltage generated in the first measurement resistor or the second measurement resistor.

5. The ground fault detection device according to claim 1, further comprising:

a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected;

a negative-electrode-side twin relay including a first negative-electrode-side C contact switch for switching between a battery negative-electrode-side contact and a ground-side contact, and a second negative-electrode-side C contact switch for switching between the battery negative-electrode-side contact and a ground-side contact;

a first switch connected in series with the first detection capacitor between a common contact of the first positive-electrode-side C contact switch and a common contact of the first negative-electrode-side C contact switch;

a second switch connected in series with the second detection capacitor between a common contact of the second positive-electrode-side C contact switch and a common contact of the second negative-electrode-side C contact switch;

a third C contact switch for switching between a contact connected with the battery positive-electrode-side and a contact connected with the battery negative-electrode-side; and a third switch connected in series with a short-circuit resistor between a common contact of the third C contact switch and ground, wherein the switching unit includes the first switch and the second switch, and wherein the control unit controls operations of the positive-electrode-side twin relay, the negative-electrode-side twin relay, the first switch, the second switch, the third C contact switch, and the third switch, and detects a decrease in insulation resistance based on a voltage generated in the first measurement resistor or the second measurement resistor.

6. The ground fault detection device according to claim 2, further comprising:

a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected;

a negative-electrode-side twin relay including a first negative-electrode-side C contact switch for switching between a battery negative-electrode-side contact and a ground-side contact, and a second negative-electrode-side C contact switch for switching between the battery negative-electrode-side contact and a ground-side contact;

a first switch connected in series with the first detection capacitor between a common contact of the first positive-electrode-side C contact switch and a common contact of the first negative-electrode-side C contact switch;

a second switch connected in series with the second detection capacitor between a common contact of the second positive-electrode-side C contact switch and a common contact of the second negative-electrode-side C contact switch;

a third C contact switch for switching between a contact connected with the battery positive-electrode-side and a contact connected with the battery negative-electrode-side; and a third switch connected in series with a short-circuit resistor between a common contact of the third C contact switch and ground, wherein the switching unit includes the first switch and the second switch, and wherein the control unit controls operations of the positive-electrode-side twin relay, the negative-electrode-side twin relay, the first switch, the second switch, the third C contact switch, and the third switch, and detects a decrease in insulation resistance based on a voltage generated in the first measurement resistor or the second measurement resistor.

7. The ground fault detection device according to claim 1, further comprising:

a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected;

a negative-electrode-side twin relay including a first negative-electrode-side C contact switch for switching between a battery negative-electrode-side contact and a ground-side contact, and a second negative-electrode-side C contact switch for switching between the battery negative-electrode-side contact and a ground-side contact;

a first switch connected in series with the first detection capacitor between a common contact of the first positive-electrode-side C contact switch and a common contact of the first negative-electrode-side C contact switch;

a second switch connected in series with the second detection capacitor between a common contact of the second positive-electrode-side C contact switch and a common contact of the second negative-electrode-side C contact switch; and a third switch connected with a short-circuit resistor between a common contact of the first positive-electrode-side C contact switch and a common contact of the first negative-electrode-side C contact switch, in parallel with the first detection capacitor and the first switch, wherein the switching unit includes the first switch and the second switch, the control unit controls operations of the positive-electrode-side twin relay, the negative-electrode-side twin relay, the first switch, the second switch, and the third switch, and detects a decrease in insulation resistance based on a voltage generated in the first measurement resistor or the second measurement resistor.

8. The ground fault detection device according to claim 2, further comprising:

a positive-electrode-side twin relay including a first positive-electrode-side C contact switch for switching between a battery positive-electrode-side contact and a measurement-side contact to which a first measurement resistor is connected, and a second positive-electrode-side C contact switch for switching between the battery positive-electrode-side contact and a measurement-side contact to which a second measurement resistor is connected;

a negative-electrode-side twin relay including a first negative-electrode-side C contact switch for switching between a battery negative-electrode-side contact and a ground-side contact, and a second negative-electrode-side C contact switch for switching between the battery negative-electrode-side contact and a ground-side contact;

a first switch connected in series with the first detection capacitor between a common contact of the first positive-electrode-side C contact switch and a common contact of the first negative-electrode-side C contact switch;

a second switch connected in series with the second detection capacitor between a common contact of the second positive-electrode-side C contact switch and a common contact of the second negative-electrode-side C contact switch; and a third switch connected with a short-circuit resistor between a common contact of the first positive-electrode-side C contact switch and a common contact of the first negative-electrode-side C contact switch, in parallel with the first detection capacitor and the first switch, wherein the switching unit includes the first switch and the second switch, the control unit controls operations of the positive-electrode-side twin relay, the negative-electrode-side twin relay, the first switch, the second switch, and the third switch, and detects a decrease in insulation resistance based on a voltage generated in the first measurement resistor or the second measurement resistor.

9. The ground fault detection device according to claim 3, further comprising a fifth switch connected between a positive-electrode plate of the second detection capacitor and the measurement-side contact of the second positive-electrode-side C contact relay.

10. The ground fault detection device according to claim 4, further comprising a fifth switch connected between a positive-electrode plate of the second detection capacitor and the measurement-side contact of the second positive-electrode-side C contact relay.

11. The ground fault detection device according to claim 5, further comprising a fifth switch connected between a positive-electrode plate of the second detection capacitor and the measurement-side contact of the second positive-electrode-side C contact relay.

12. The ground fault detection device according to claim 6, further comprising a fifth switch connected between a positive-electrode plate of the second detection capacitor and the measurement-side contact of the second positive-electrode-side C contact relay.

13. The ground fault detection device according to claim 7, further comprising a fifth switch connected between a positive-electrode plate of the second detection capacitor and the measurement-side contact of the second positive-electrode-side C contact relay.

14. The ground fault detection device according to claim 8, further comprising a fifth switch connected between a positive-electrode plate of the second detection capacitor and the measurement-side contact of the second positive-electrode-side C contact relay.

* * * * *